United States Patent
Tsai et al.

(10) Patent No.: US 11,211,471 B1
(45) Date of Patent: Dec. 28, 2021

(54) METHOD OF MANUFACTURING A SEMICONDUCTOR DEVICE

(71) Applicant: UNITED MICROELECTRONICS CORP., Hsin-Chu (TW)

(72) Inventors: Fu-Shou Tsai, Keelung (TW); Yong-Yi Lin, Miaoli County (TW); Yang-Ju Lu, Changhua County (TW); Yu-Lung Shih, Tainan (TW); Ji-Min Lin, Taichung (TW); Ching-Yang Chuang, Pingtung County (TW); Kun-Ju Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/017,666

(22) Filed: Sep. 10, 2020

(51) Int. Cl.
*H01L 29/66* (2006.01)
*H01L 29/423* (2006.01)
*H01L 29/40* (2006.01)

(52) U.S. Cl.
CPC ...... *H01L 29/66545* (2013.01); *H01L 29/401* (2013.01); *H01L 29/4236* (2013.01); *H01L 29/42364* (2013.01); *H01L 29/42372* (2013.01)

(58) Field of Classification Search
CPC ............. H01L 29/66545; H01L 29/401; H01L 29/4262; H01L 29/42364; H01L 29/42372
See application file for complete search history.

(56) References Cited

U.S. PATENT DOCUMENTS

| | | |
|---|---|---|
| 5,960,270 A | 9/1999 | Misra |
| 6,054,355 A | 4/2000 | Inumiya |
| 6,069,069 A | 5/2000 | Chooi |
| 6,087,231 A | 7/2000 | Xiang |
| 6,177,303 B1 | 1/2001 | Schmitz |
| 6,251,763 B1 | 6/2001 | Inumiya |
| 6,579,784 B1 | 6/2003 | Huang |
| 6,607,950 B2 | 8/2003 | Henson |
| 6,953,719 B2 | 10/2005 | Doczy |
| 7,517,746 B2 | 4/2009 | Lin |
| 7,981,801 B2 | 7/2011 | Chuang |
| 8,673,755 B2 | 3/2014 | Chang |
| 8,846,513 B2 * | 9/2014 | Baars ............... H01L 21/76814 438/586 |
| 8,932,951 B2 | 1/2015 | Wu |
| 9,378,968 B2 | 6/2016 | Wu |
| 9,646,840 B2 | 5/2017 | Zhao |
| 10,014,225 B1 | 7/2018 | Bao |
| 2018/0261514 A1 * | 9/2018 | Xie .................. H01L 29/517 |
| 2021/0098376 A1 * | 4/2021 | Lin ................... H01L 21/31116 |

* cited by examiner

*Primary Examiner* — Zandra V Smith
*Assistant Examiner* — Andre C Stevenson
(74) *Attorney, Agent, or Firm* — Winston Hsu

(57) ABSTRACT

The present invention discloses a metal gate process. A sacrificial nitride layer is introduced during the fabrication of metal gates. The gate height can be well controlled by introducing the sacrificial nitride layer. Further, the particle fall-on problem can be effectively solved.

7 Claims, 5 Drawing Sheets

METHOD OF MANUFACTURING A SEMICONDUCTOR DEVICE

BACKGROUND OF THE INVENTION

1. Field of the Invention

The present invention relates to the field of semiconductor technology, and in particular to an improved method of manufacturing a semiconductor transistor device.

2. Description of the Prior Art

As known in the art, one process of forming a metal gate stack is termed a replacement or "gate last" process in which the final gate stack is fabricated "last", which allows for reduced number of subsequent processes including high temperature processing that is performed after formation of the gate.

Tungsten is used as a gate electrode material in the transistor because of its superior electrical characteristics over polysilicon which has been traditionally used as gate electrode material. For example, to form the tungsten gate, a layer of tungsten is deposited into gate trenches formed after dummy poly removal (DPR) process. The layer of tungsten is then subjected to a tungsten CMP process to remove excess tungsten outside the gate trenches.

One of the commonly encountered problems in CMP in particular in metal applications such as tungsten is dishing. If the dishing is too high the remaining W thickness will be too low therefore the resistivity will be too high. Further, residual slurry particles may prone to adsorb on the polished surface of the oxide dielectric layer, which are difficult to be removed.

SUMMARY OF THE INVENTION

One object of the present invention is to provide an improved method of manufacturing a semiconductor device to solve the above-mentioned shortcomings and shortcomings of the prior art.

One aspect of the invention provides a method for fabricating a semiconductor device. A substrate having thereon a first dummy gate, a second dummy gate, and an inter-layer dielectric (ILD) layer between the first dummy gate and the second dummy gate is provided. The first dummy gate includes a first polysilicon layer and a first nitride cap layer, and the second dummy gate includes a second polysilicon layer and a second nitride cap layer. A first nitride layer is deposited on the first dummy gate, the second dummy gate, and the ILD layer. The first nitride layer, the first nitride cap layer and the second nitride cap layer are polished, thereby exposing the first polysilicon layer and the second polysilicon layer, and a sacrificial nitride layer is formed on the ILD layer. The first polysilicon layer and the second polysilicon layer are removed, thereby forming a first gate trench and a second gate trench, respectively. A metal layer is deposited on the sacrificial nitride layer and within the first gate trench and the second gate trench. The metal layer is polished until the sacrificial nitride layer is exposed, thereby forming a first metal gate in the first gate trench and a second metal gate in the second gate trench. The first metal gate and the second metal gate are etched to form a first recess and a second recess on the first metal gate and the second metal gate, respectively. A second nitride layer is deposited on the sacrificial nitride layer and within the first recess and the second recess. The second nitride layer, the sacrificial nitride layer, and the ILD layer are polished, thereby removing the sacrificial nitride layer from the ILD layer.

According to some embodiments, the ILD layer comprises a concave top surface and the sacrificial nitride layer is disposed on the concave top surface.

According to some embodiments, a top surface of the sacrificial nitride layer is coplanar with a top surface of the first polysilicon layer and the second polysilicon layer According to some embodiments, the first nitride layer comprises a silicon nitride layer.

According to some embodiments, the ILD layer comprises a high-density plasma chemical vapor deposition (HDPCVD) oxide layer.

According to some embodiments, the second nitride layer comprises a silicon nitride layer.

According to some embodiments, the metal layer comprises a tungsten layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
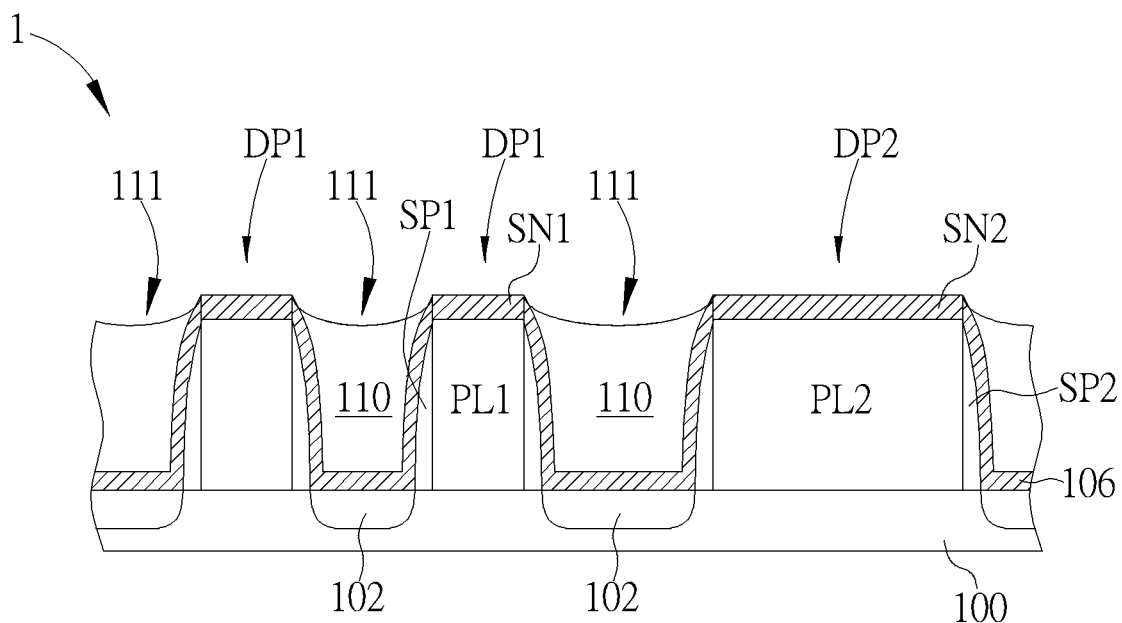
FIG. 1 to FIG. 9 are schematic diagrams showing an exemplary method for forming a semiconductor device according to an embodiment of the present invention.

Please refer to FIG. 1 to FIG. 9. FIG. 1 to FIG. 9 are schematic diagrams showing an exemplary method for forming a semiconductor device 1, for example, a semiconductor transistor device, according to an embodiment of the present invention. As shown in FIG. 1, a substrate 100 such as a semiconductor substrate is provided. According to an embodiment of the invention, the substrate 100 may comprise any suitable semiconductor material such as silicon, gallium arsenide, silicon germanium or the like. In addition, the substrate 100 may comprise a silicon-on-insulator (SOI) substrate.

According to an embodiment of the invention, a first dummy gate DP1 and a second dummy gate DP2 may be formed on the substrate 100. According to an embodiment of the invention, the first dummy gate DP1 and the second dummy gate DP2 may have different gate critical dimensions. For example, the first dummy gate DP1 may have a critical dimension of about 20 nm and the second dummy gate DP2 may have a critical dimension of about 250 nm. According to an embodiment of the invention, the first dummy gate DP1 may be used as a gate electrode of a logic circuit device such as an NFET or a PFET device.

According to an embodiment of the invention, the first dummy gate DP1 may comprise a first polysilicon layer PL1 and a first nitride cap layer SN1 on the first polysilicon layer PL1. The second dummy gate DP2 may comprise a second polysilicon layer PL2 and a second nitride cap layer SN2 on the second polysilicon layer PL2. According to an embodiment of the invention, the first nitride cap layer SN1 is a silicon nitride layer. According to an embodiment of the invention, the second nitride cap layer SN2 is a silicon nitride layer.

According to an embodiment of the invention, a first sidewall spacer SP1 may be formed on the first dummy gate DP1 and a second sidewall spacer SP2 may be formed on the second dummy gate DP2. The sidewall spacers SP1 and SP2 are composed of insulating materials, and, preferably, include a nitride or oxide material. In one embodiment, the sidewall spacers SP1 and SP2 may be a stack of insulating materials, but not limited thereto.

According to an embodiment of the invention, source/drain regions 102 are provided in the substrate 100 between the first dummy gate DP1 and the second dummy gate DP2. The source/drain regions 102 may have a conductivity that is opposite to that of the substrate 100. For example, the source/drain regions 102 may be N type doped regions and the substrate 100 may be a P type substrate.

According to an embodiment of the invention, an interlayer dielectric (ILD) layer 110 may be deposited on the substrate 100 and between the first dummy gate DP1 and the second dummy gate DP2. According to an embodiment of the invention, before the deposition of the ILD layer 110, a contact etch stop layer (CESL) 106 such as a silicon nitride layer may be conformally deposited on the substrate 100. According to an embodiment of the invention, the ILD layer 110 may be a high-density plasma oxide (HDP oxide) layer, which may be deposited by using a high-density plasma chemical vapor deposition (HDPCVD) process. The ILD layer 110 is then subjected to a chemical mechanical polishing (CMP) process until the first nitride cap layer SN1 and the second nitride cap layer SN2 are exposed. According to an embodiment of the invention, after the CMP process, the ILD layer 110 may have a concave, curved top surface 111 because of the dishing effect.

Figure 2:
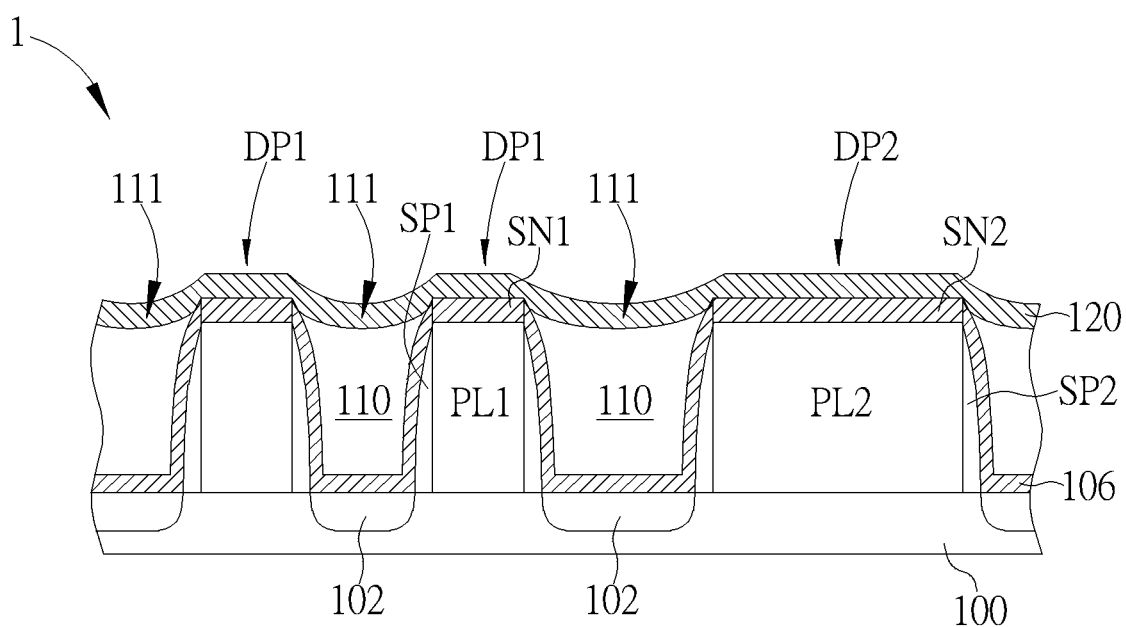

Subsequently, as shown in FIG. 2, a first nitride layer 120 is deposited on the first dummy gate DP1, the second dummy gate DP2, and the ILD layer 110. According to an embodiment of the invention, the first nitride layer 120 is in direct contact with the ILD layer 110, the first nitride cap layer SN1 and the second nitride cap layer SN2. According to an embodiment of the invention, the first nitride layer 120 is a silicon nitride layer.

Figure 3:
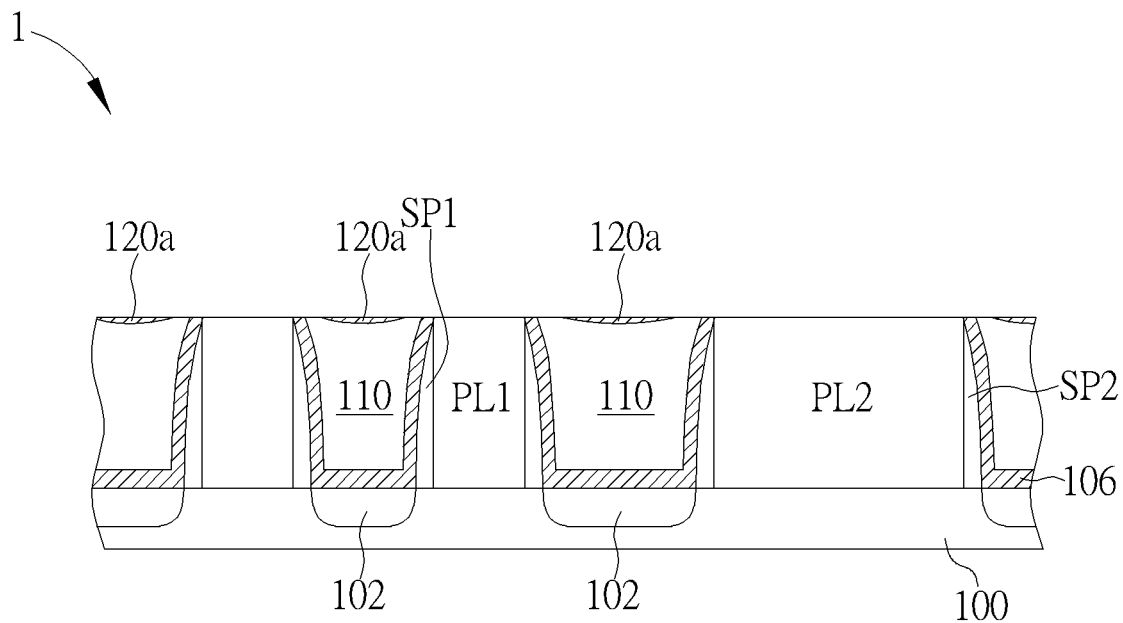
Figure 4:
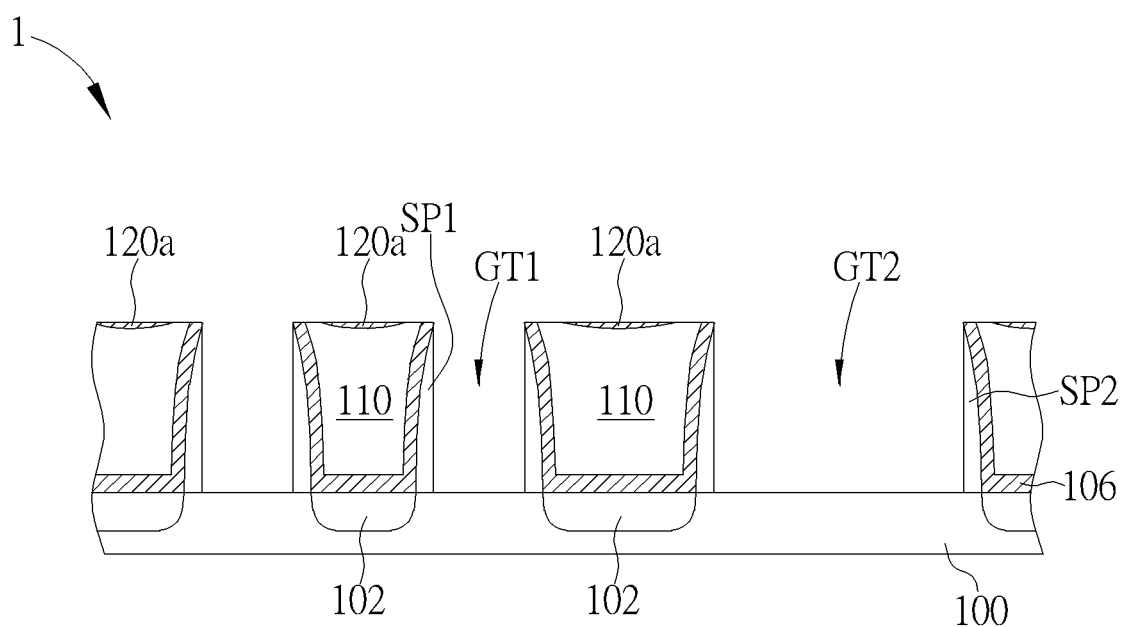

As shown in FIG. 3, a poly opening polish (POP) CMP process is carried out. The first nitride layer 120, the first nitride cap layer SN1 and the second nitride cap layer SN2 are polished. After the POPCMP process is completed, the first polysilicon layer PL1 and the second polysilicon layer PL2 are exposed and a sacrificial nitride layer 120a is formed on the ILD layer 110. According to an embodiment of the invention, as previously mentioned, the ILD layer 110 comprises a concave top surface 111 and the first nitride layer 120a not removed by the POPCMP process remains on the concave top surface 111 and forms the sacrificial nitride layer 120a. According to an embodiment of the invention, at this point, a top surface of the sacrificial nitride layer is coplanar with a top surface of the first polysilicon layer and the second polysilicon layer As shown in FIG. 4, a dummy poly removal (DPR) process is then carried out to remove the first polysilicon layer PL1 and the second polysilicon layer PL2, thereby forming a first gate trench GT1 and a second gate trench GT2, respectively.

Figure 5:
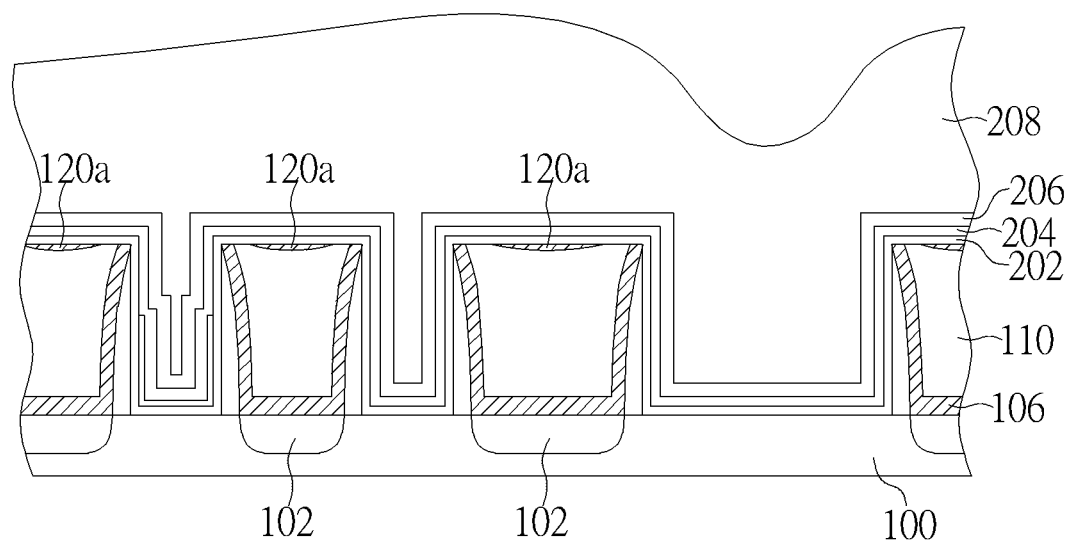

As shown in FIG. 5, a gate dielectric layer 202 and a diffusion barrier layer 204 may be formed in the gate trenches GT1 and GT2 and on the sacrificial nitride layer 120a by chemical vapor deposition (CVD), physical vapor deposition (PVD), atomic layer deposition (ALD), molecular beam epitaxy (MBE), plating, combinations of the above or the like. However, it is not necessary that the gate dielectric layer 202 and the diffusion barrier layer 204 be formed by the same process. The gate dielectric layer 202 can be any dielectric material, such as silicon dioxide, a high-k material, a metal-oxy-nitride, a metal oxide, a metal silicate, or a metal aluminate. For example, the gate dielectric layer 202 can be silicon nitride, silicon dioxide, $HfO_2$, $ZrO_2$, $HfSi_xO_y$, $SiO_xN_y$, or the like. According to an embodiment of the invention, an interfacial layer (not shown) can be formed between the gate dielectric layer 202 and the substrate 100. According to an embodiment of the invention, the diffusion barrier layer 204 may comprise titanium nitride (TiN), but is not limited thereto.

According to an embodiment of the invention, a work function metal layer 206 including, but not limited to, TiN, tantalum nitride (TaN), titanium carbide (TiC), tantalum carbide (TaC), tungsten carbide (WC), aluminum titanium nitride (TiAlN), titanium aluminide (TiAl), zirconium aluminide (ZrAl), tungsten aluminide (WAl), tantalum aluminide (TaAl), or hafnium aluminide (HfAl) may be deposited on the diffusion barrier layer 204. According to an embodiment of the invention, the work function metal layer 206 may be a single-layered structure or a multi-layered structure.

After forming the work function metal layer 206, a metal layer 208 is deposited over the substrate 100 by CVD, PVD, ALD, MBE, plating or combinations thereof. The metal layer 208 is a metal with a low resistivity such as W, Al, Au, Cu, Ag, Pt, a metal silicide, or combinations thereof. According to an embodiment of the invention, the metal layer 208 comprises a tungsten layer.

Figure 6:
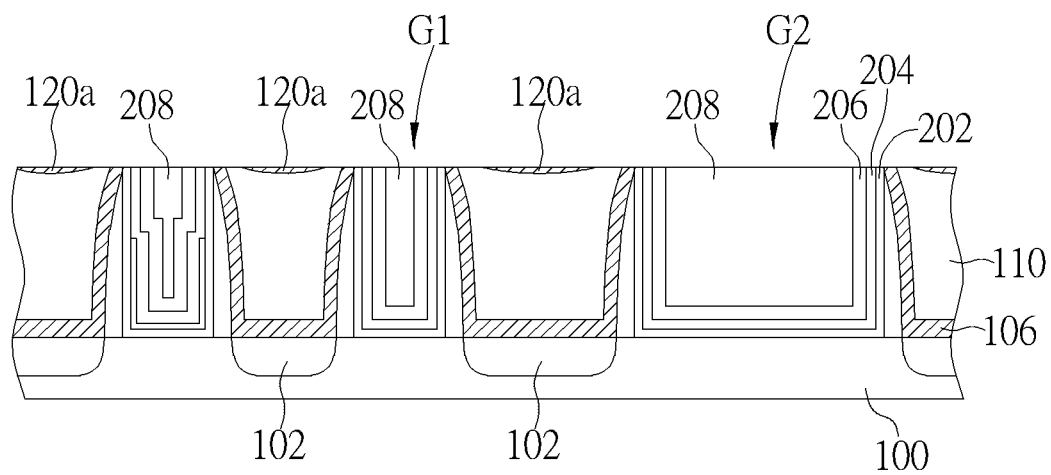

As shown in FIG. 6, a tungsten CMP (WCMP) process is then carried out to planarize the metal layer 208, the work function metal layer 206, the diffusion barrier layer 204 and the gate dielectric layer 202 until the sacrificial nitride layer 120a is revealed, thereby forming metal gates G1 and G2 within the gate trenches GT1 and GT2, respectively. The dishing of the ILD layer 110 during the tungsten CMP process can be avoided or alleviated due to the existence of the sacrificial nitride layer 120a. Further, since the sacrificial nitride layer 120a presents a positive zeta potential in the acidic CMP slurry, the adsorption of slurry particles to the top surface of the ILD layer 110 can be reduced.

Figure 7:
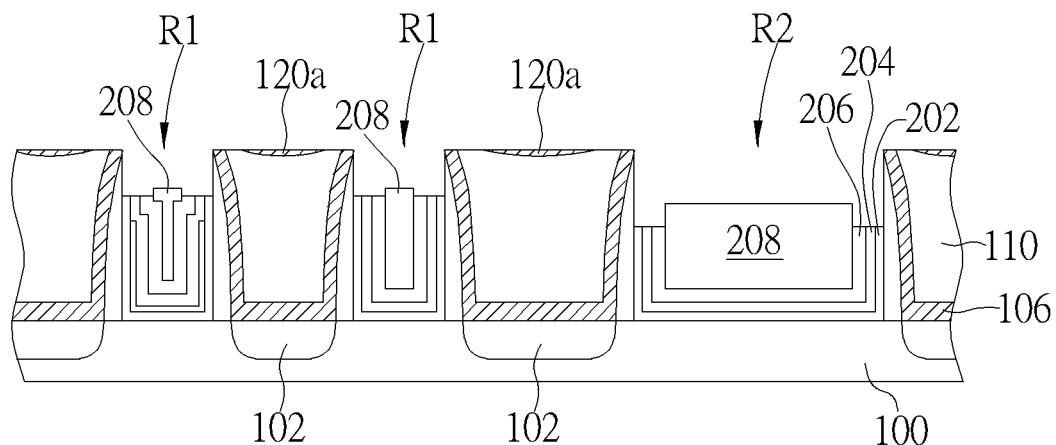

As shown in FIG. 7, the metal gate G1 and metal gate G2 are etched to form a recess R1 and a recess R2 on the metal gate G1 and the metal gate G2, respectively. The etching of the metal gate G1 and metal gate G2 may be accomplished by any known technique, including but not limited to wet or dry etching. For example, the upper portions of the gate dielectric layer 202, the diffusion barrier layer 204 and the work function metal layer 206 can be selectively removed by an etching process such as a wet etching process. For example, the metal layer 208 may be etched back by using an etching process such as a dry etching process. According to an embodiment of the invention, there may be a step height of about 60 angstroms between a top surface of the remaining metal layer 208 and the top surface of the gate dielectric layer 202, the diffusion barrier layer 204 and the work function metal layer 206 around the metal layer 208 in the recess R1.

Figure 8:
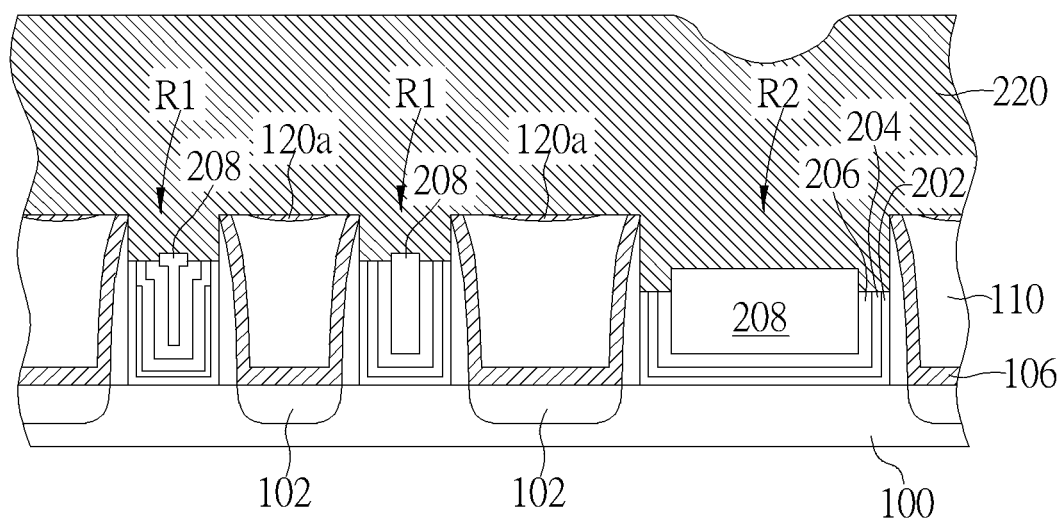

As shown in FIG. 8, after the etching back of the metal layer 208 and the formation of the recesses R1 and R2, a second nitride layer 220 such as a silicon nitride layer is deposited over the substrate 100 in a blanket manner. The second nitride layer 220 is deposited on the sacrificial nitride layer 120a and within the recesses R1 and R2. The second nitride layer 220 may be formed by any appropriate deposition technique such as CVD processes. For example, the second nitride layer 220 may have a thickness of about 1000-1050 angstroms.

Figure 9:
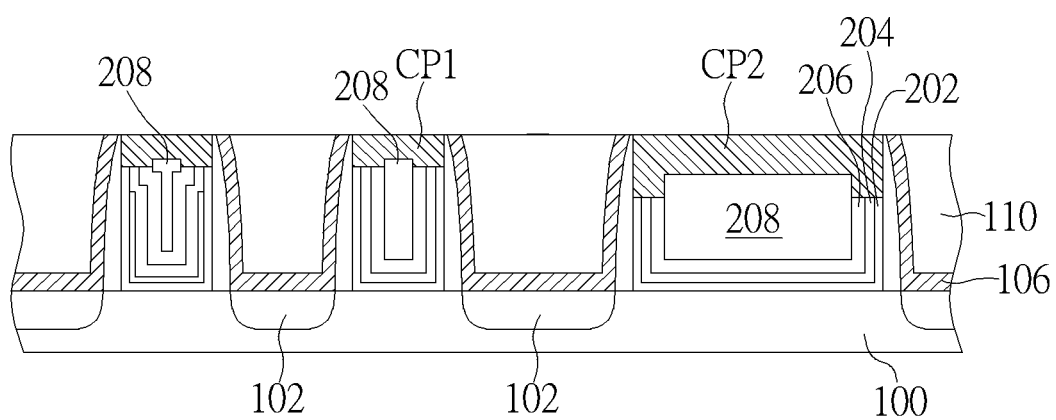

As shown in FIG. 9, a CMP process is then performed to polish the second nitride layer 220, the sacrificial nitride layer 120a, and the ILD layer 110, thereby forming a cap layer CP1 and a cap layer CP2 on the metal gate G1 and metal gate G2, respectively. During the CMP process, the sacrificial nitride layer 120a is removed from the ILD layer 110. It is advantageous to use the present invention method because the gate height can be well controlled by introducing the sacrificial nitride layer 120a. Further, the particle fall-on problem can be effectively solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having thereon a first dummy gate, a second dummy gate, and an inter-layer dielectric (ILD) layer between the first dummy gate and the second dummy gate, wherein the first dummy gate comprises a first polysilicon layer and a first nitride cap layer, and the second dummy gate comprises a second polysilicon layer and a second nitride cap layer;
   depositing a first nitride layer on the first dummy gate, the second dummy gate, and the ILD layer;
   polishing the first nitride layer, the first nitride cap layer and the second nitride cap layer, thereby exposing the first polysilicon layer and the second polysilicon layer, and forming a sacrificial nitride layer on the ILD layer;
   removing the first polysilicon layer and the second polysilicon layer, thereby forming a first gate trench and a second gate trench, respectively;
   depositing a metal layer on the sacrificial nitride layer and within the first gate trench and the second gate trench;
   polishing the metal layer until the sacrificial nitride layer is exposed, thereby forming a first metal gate in the first gate trench and a second metal gate in the second gate trench;
   etching the first metal gate and the second metal gate to form a first recess and a second recess on the first metal gate and the second metal gate, respectively;
   depositing a second nitride layer on the sacrificial nitride layer and within the first recess and the second recess; and
   polishing the second nitride layer, the sacrificial nitride layer, and the ILD layer, thereby removing the sacrificial nitride layer from the ILD layer.

2. The method according to claim 1, wherein the ILD layer comprises a concave top surface and the sacrificial nitride layer is disposed on the concave top surface.

3. The method according to claim 1, wherein a top surface of the sacrificial nitride layer is coplanar with a top surface of the first polysilicon layer and the second polysilicon layer.

4. The method according to claim 1, wherein the first nitride layer comprises a silicon nitride layer.

5. The method according to claim 1, wherein the ILD layer comprises a high-density plasma chemical vapor deposition (HDPCVD) oxide layer.

6. The method according to claim 1, wherein the second nitride layer comprises a silicon nitride layer.

7. The method according to claim 1, wherein the metal layer comprises a tungsten layer.

* * * * *